US010401402B2

(12) United States Patent
Rieken et al.

(10) Patent No.: US 10,401,402 B2
(45) Date of Patent: Sep. 3, 2019

(54) SYNCHRONIZED PHASOR MEASUREMENT IN POWER DISTRIBUTION NETWORKS

(71) Applicant: Aclara Technologies LLC, Hazelwood, MO (US)

(72) Inventors: David W. Rieken, St. Peters, MO (US); Gregory Berchin, Lake Saint Louis, MO (US); Lakshan Prageeth Piyasinghe, Florissant, MO (US); Albert Fargnoli, St. Louis, MO (US); Saeed Mirshekari, St. Louis, MO (US)

(73) Assignee: Aclara Technologies LLC, Hazelwood, MO (US)

( * ) Notice: Subject to any disclaimer, the term of this patent is extended or adjusted under 35 U.S.C. 154(b) by 312 days.

(21) Appl. No.: 15/219,775

(22) Filed: Jul. 26, 2016

(65) Prior Publication Data
US 2018/0031617 A1 Feb. 1, 2018

(51) Int. Cl.
G01R 21/133 (2006.01)
G01D 4/00 (2006.01)
H02J 13/00 (2006.01)
G01R 19/25 (2006.01)
G01R 29/18 (2006.01)

(52) U.S. Cl.
CPC ........... *G01R 21/133* (2013.01); *G01D 4/004* (2013.01); *G01R 19/2513* (2013.01); *G01R 29/18* (2013.01); *H02J 13/00* (2013.01); *Y02E 60/728* (2013.01); *Y04S 10/265* (2013.01)

(58) Field of Classification Search
CPC ........ G01R 21/133; G01D 4/004; H02J 13/00
See application file for complete search history.

(56) References Cited

U.S. PATENT DOCUMENTS

| 5,043,653 | A | 8/1991 | Foster et al. |
| 5,373,236 | A | 12/1994 | Tsui et al. |
| 5,995,911 | A | 11/1999 | Hart |
| 7,180,940 | B2 | 2/2007 | Li et al. |
| 7,684,441 | B2 * | 3/2010 | Bickel ................. H02J 13/0006 370/503 |

(Continued)

FOREIGN PATENT DOCUMENTS

WO WO2006113965 A1 11/2006

OTHER PUBLICATIONS

Akanksha Pachpinde, "Real time monitoring of distribution networks using internet based PMU", Thesis submitted to University at Buffalo, State University of New York, 2014.*

(Continued)

Primary Examiner — Mohamed Charioui
Assistant Examiner — Catherine T. Rastovski
(74) Attorney, Agent, or Firm — Stinson LLP

(57) ABSTRACT

Systems and methods for synchronized phasor measurement in a power distribution network are described. In an aspect, the systems and methods quantify the phase angle between voltages or currents at any two points in the distribution network. In another aspect, the systems and methods establish a common time reference between points on a power distribution network by transmitting a synchronization pulse throughout the distribution network. In an additional aspect, the systems and methods extract phasors from a power line waveform by utilizing a phase-locked loop (PLL) and regression of the zero-crossings of the PLL output waveform.

28 Claims, 9 Drawing Sheets

(56) References Cited

U.S. PATENT DOCUMENTS

| | | |
|---|---|---|
| 9,318,920 B2 | 4/2016 | Vukojevic et al. |
| 2003/0158677 A1 | 8/2003 | Swarztrauber et al. |
| 2004/0263147 A1 | 12/2004 | Piesinger |
| 2007/0014313 A1 | 1/2007 | Bickel et al. |
| 2008/0222068 A1 | 9/2008 | Bahl et al. |
| 2011/0208364 A1 | 8/2011 | DeLoach, Jr. |
| 2012/0201155 A1* | 8/2012 | Du .................. H04B 3/54 370/252 |
| 2014/0161114 A1 | 6/2014 | Shuey |
| 2014/0371929 A1 | 12/2014 | Allen et al. |
| 2015/0137865 A1 | 5/2015 | Tohzaka et al. |
| 2015/0229824 A1* | 8/2015 | Tanaka ............... H04N 5/217 348/228.1 |
| 2016/0054425 A1 | 2/2016 | Katz |
| 2016/0124421 A1 | 5/2016 | Hansell et al. |
| 2016/0154040 A1 | 6/2016 | Driscoll et al. |
| 2016/0198245 A1 | 7/2016 | Rhoads et al. |

OTHER PUBLICATIONS

J. Faiz, H. Ebrahimpour, and P. Pillay, "Influence of unbalanced voltage on the steady-state performance of a three-phase squirrel-cage induction motor," Energy Conversion, IEEE Transactions on, vol. 19, No. 4, pp. 657-662, 2004.
R.B. Standler, "Legal liability for electricity in the USA: Products liability," http//www.rbs2.com/utility.pdf, 2011.
X. Fang, S. Misra, G. Xue, and D. Yang, "Smart grid-the new and improved power grid: A survey," Communications Surveys & Tutorials, IEEE, vol. 14, No. 4, pp. 944-980, 2012.
F. Bouhafs, M. Mackay, and M. Merabti, "Links to the future: Communication requirements and challenges in the smart grid," Power andEnergy Magazine, IEEE, vol. 10, No. 1, pp. 24-32, 2012.
V.C. Gungor, D. Sahin, T. Kocak, S. Ergut, C. Buccella, C. Cecati, and G.P. Hancke, "A survey on smart grid potential applications and communication requirements," Industrial Informatics, IEEE Transactions on, vol. 9, No. 1, pp. 28-42, 2013.
H. Farhangi, "The path of the smart grid," IEEE Power and Energy Magazine, vol. 8, No. 1, pp. 18-28, Jan. 2010.
V. Terzija, G. Valverde, D. Cai, P. Regulski, V. ZMadani, J. Fitch, S. Skok, M. M. Begovic, and A. Phadke, "Wide-area monitoring, protection, and control of future electric power networks," Proceedings of the IEEE, vol. 99, No. 1, pp. 8-93, 2011.
"Distributed energy resources and managment of future distribution," EPRI, Palo Alto, CA, p. 1020832, 2010.
T.A. Short, Electric power distribution handbook. CRC press, 2014.
C.A. Hill, M.C. Such, D. Chen, J. Gonzalez, and W.M. Grady, "Battery energy storage for enabling integration of distributed solar power generation," Smart Grid, IEEE Transactions on, vol. 3, No. 2, pp. 850-857, 2012.
"American national standard for electrical power systems nd equipment-voltage ratings (60 hertz)." ANSI C84.1, 2006.
C.Y. Lee, "Effects of unbalanced voltage on the operation performance of a three-phase induction motor," Energy Conversion, IEEE Transaction on vol. 14, No. 2, p. 202-2-8, 1999.
M. Patel, S. Aivaliotis, E. Ellen et al., "Real-time application of synchrophasors for improving realiatiy," NERC Report, Oct. 2010.
J. Tlusty, A. Kasembe, Z. Muller, J. Svec, T. Sykora, A. Popelka, E. V. Mgaya, and O'Diallo, "The monitoring of power system events on transmission and distribution level by the use of phasor measurements units (pmu)," in Electricity Distribution—Part 1, 2009. CIRED 2009. 20th International Conference and Exhibition on. IET, 2009, pp. 1-4.
M.H. Xivambu, "Impact of floating neutral in distribution systems," CIRED 19th International Conference on Electricity Distribution, 2007.
S. Dasgupta, M. Paramasivam, U. Vaidya, and C. Ajjarapu, "Real-time monitoring of short-term voltage stability using pmu data," Power Systems, IEEE Transactions on, vol. 28, No. 4, pp. 3702-3711, 2013.
H. Wu and J Giri, "Pmu impact on state estimation reliability for improved grid security," in Transmission and Distribution Conference and Exhibition, 2005/2006 IEEE PES. IEEE, 2006, pp. 1349-1351.
J.E. Tate and T.J. Overbye, "Line outage detection using phasor angle measurements," Power systems, IEEE Transactions on, vol. 23, No. 4. pp. 1644-1652, 2008.
A. Abdelaziz, S. Mekhamer, M. Ezzat, and E. El-Saadany, "Line outage detection using support vector machine (svm) based on the phasor measurement units (pmus) technology," in Power and Energy Society Genral Meeting, 2012 IEEE. IEEE, 2012, pp. 1-8.
M. Hojo, K. Ohnishi, T. Ohnishi, Y. Milani, O. Saeki, and H. Ukai, "Analysis of load frequency control dynamics based on multiple synchronized phasor measurements," 15th PSCC, Liege Aug. pp. 22-26, 2005.
P. Ju, C. Qin, F. Wu, H. Xie, and Y. Ning, "Load modeling for wide area power system," International Journal of Electrical Power & Energy Systems, vol. 33, No. 4, pp. 909-917, 2011.
J. De La Ree, V. Centeno, J.S. Thorp, and A.G. Phadke, "Synchronizd phasor measurement applications in power systems," Smart Grid, IEEE Transactions on, vol. 1, No. 1, pp. 20-27, 2010.
A.E. Pachpinde, Real time monitoring of distribution networks using internet based PMU. State University of New York at Buffalo, 2014.
D.W. Rieken, "Periodic noise in very low frequency power-line communications," in Power Line Communications and Its Applications (ISPLC), 2011 IEEEE Internatioal Symposium on, Apr. 2011, pp. 295-300.
D.W. Rieken, Z. Li, and C. Fleck, "Vlf-band power line channel sounding," in Power Line Communications and its Applications (ISPLC), 2024 18th IEEE International Symposium on, Mar. 2014, pp. 18-23.
D.W. Rieken and M.R. Walker, "Distance effects in low-frequency power line communications," in Power Line Communications and Its Applications (ISPLC), 2010 IEEEE International Symposium on, Mar. 2010, pp. 22-27.
B. Varadarajan, I.H. Kim, A. Dabak, D. Rieken, and G. Gregg, "Empirical measurements of the low-frequency power-line communications channel in rural north America," in Power Line Communications and Its Applications (ISPLC), 2011 IEEEE International Symposium on, Apr. 2011, pp. 463-467.
D.W. Rieken, "Maximum-likelihood estimation of the frequency response of a low requency power-line communication channel," in Power Line Communications and Its Applications, 2008. ISPLC 2008. IEEEE International Symposium on, Apr. 2008, pp. 228-233.
H. Eklund, "Real Time Phase Locked Loops", Lulea University of Technology, 2006:284 CIV—ISSN: 1402-1617—ISRN: LTU-EX-06/284—SE; hanekl-0@student.luth.se, Sep. 2004 to Mar. 2005.
Thiago R. F. Mendonca, Milena F.Pinto, Carlos A. Duque, "Least Squares Optimization of Zero Crossing Technique for Frequency Estimation of Power System Grid Distorted Sinusoidal Signals", Electrical Engineering Department, Federal University of Juiz de Fora. UFJF, Juiz de Fora, Brazil, thiago.mendonca@engenharia.ufjf.br, carlos.duque@ufjf.edu.br, 2014 IEEE, pp. 4799-5551.
Gerson Eduardo Mog, Researcher, Lactec, and Eduardo Parent Ribeiro, Dr., UFPR, Zero Crossing Determination by Linear Interpolation of Sampled Sinusoidal Signals, Lactec (Institute of Technology for Development) and UFPR (Federal University of Parana), Curitiba, PR, Brazil (gerson@lactec.org.br) and Electric Engineer Department of UFPR (edu@eletrica.ufpr.br), pp. 1-4.

* cited by examiner

SYNCHRONIZED PHASOR MEASUREMENT IN POWER DISTRIBUTION NETWORKS

BACKGROUND

The present invention generally relates to power distribution networks and, in particular, a system and a method of estimating the phase of the voltage at a sensing point in a power distribution network relative to the phase of the voltage at another point in the power distribution network.

Conventional phasor measurement units (PMUs) use global positioning system (GPS) radio clocks to synchronize dispersed measurements to a common time. However, these PMUs are limited to deployment on transmission networks due to factors such as cost of the units, burden on communications networks, GPS satellite visibility concerns, and the like. Thus, these PMUs are unable to provide real-time monitoring and awareness of phasor angles at all locations in the distribution system. Accordingly, the reliability, flexibility, efficiency, and safety of distribution system operations are compromised, which can lead to system failures and power factor and voltage profiles that fail to meet required standards.

SUMMARY

In one form, a system for utilizing power line communications to provide synchronized phasor measurements ubiquitously throughout a power distribution network is described. The system includes an electric distribution network, at least one metering device, and a synchronizer device. The metering device is connected to the electric distribution network. The synchronizer device is connected to the electric distribution network at a three-phase point and adapted to generate a beacon transmitting to the metering device via the electric distribution network. The beacon includes a synchronization pulse adapted to establish a common time reference between the synchronizer device and the metering device. The beacon also includes reference phasor data adapted to establish phase references relative to the synchronizer device at the metering device.

In another form, a method for determining a phase difference between phasors at a metering device and a reference phasor at a synchronizer device is described. A synchronizer generates a first beacon that includes a first synchronization pulse and a first communications package. The synchronizer transmits the first beacon to one or more electric meters connected to the synchronizer by an electric distribution network. The synchronizer is coupled to the electric distribution network at a three-phase connection point. The synchronizer measures a phase and an amplitude of a voltage on the electric distribution network at the three-phase connection point during the transmitting of the first beacon. The measured voltage phase and voltage amplitude comprise a reference voltage phasor corresponding to the first synchronization pulse. The synchronizer generates a second beacon that includes a second synchronization pulse and a second communications package. The second communications package includes the reference voltage phasor corresponding to the first synchronization pulse. The synchronizer transmits the second beacon to the electric meters via the electric distribution network, which enables the electric meters to determine a voltage phasor measured at the electric meter relative to the reference voltage phasor at a time of receiving the first beacon.

Other objects and features will be in part apparent and in part pointed out hereinafter.

BRIEF DESCRIPTION OF THE DRAWINGS AND APPENDIX

Figure 1:
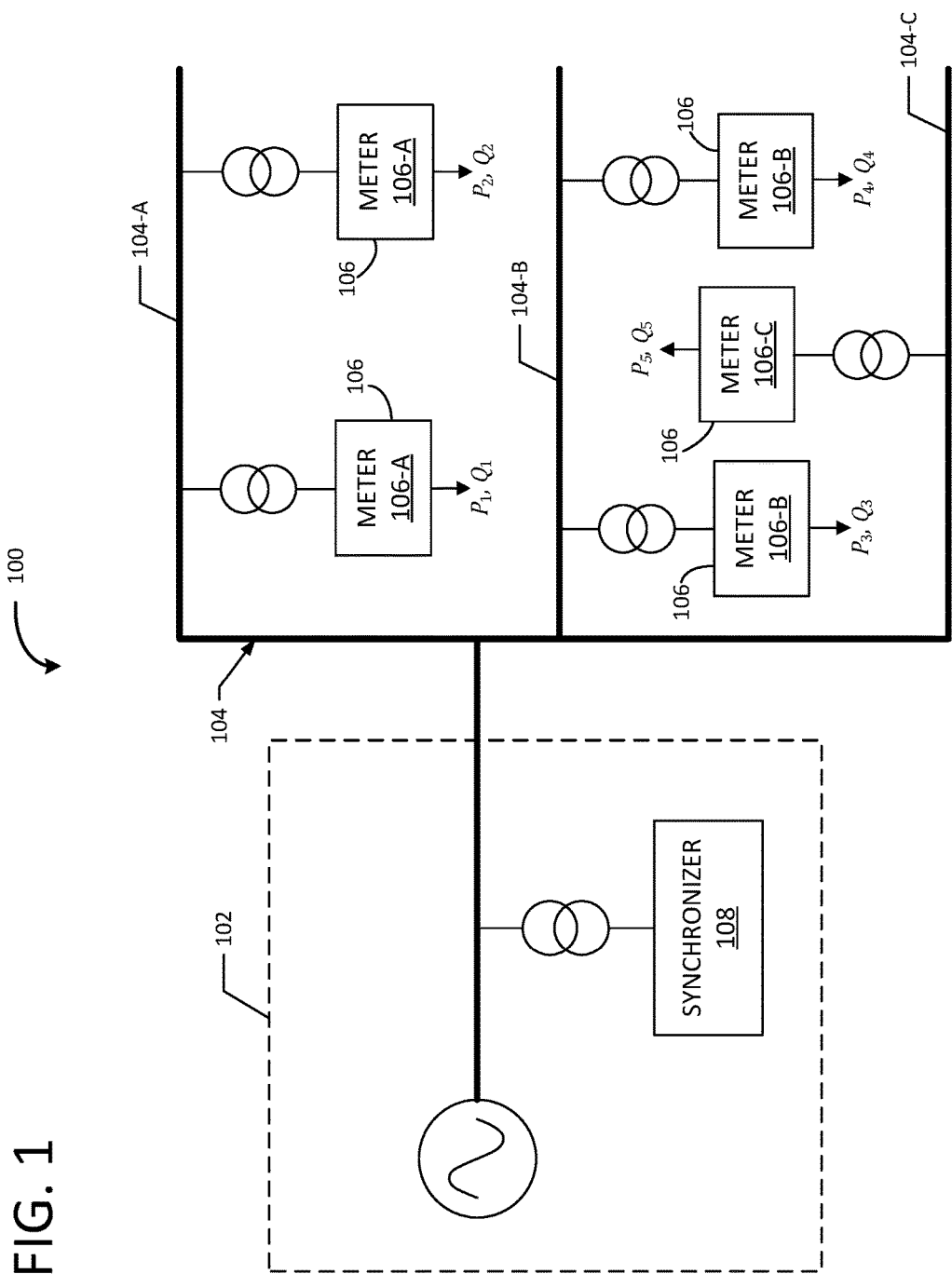
FIG. 1 is a block diagram illustrating one embodiment of an exemplary phasor measurement system for implementing the described invention.

APPENDIX A provides one embodiment of details regarding phasor extraction from power line waveforms.

Corresponding reference characters indicate corresponding parts throughout the drawings.

DETAILED DESCRIPTION

The described system connects to a power distribution network for transmitting and receiving data. The described system and methods quantify the phase angle between voltage and current phasor measurements at a point or between any two points in the power distribution network and does not require GPS or other external clock reference for time synchronization. For example, the system measures the phase of the mains voltage at any capable metering device relative to a mains voltage of its parent substation. The system also measures the current phasor synchronously with the voltage phasor at any capable metering device, and thus synchronously with the voltage phasor of the parent substation. In one form, the system is implemented in embedded firmware at metering points and utilizes one very low frequency (VLF)-band and/or ultra low frequency (ULF)-band transmitter at each substation on the power distribution network.

FIG. 1 illustrates an exemplary synchronized phasor (i.e., synchrophasor) measurement system, generally indicated at 100, in accordance with an embodiment of the invention. The synchronized phasor measurement system 100 includes a substation 102, a power distribution network 104, and metering devices 106. The substation 102 includes a synchronizer device 108. The metering devices 106 are mechanically, electrically, and/or communicatively connected to aspects of the power distribution network 104. As illustrated in FIG. 1, the metering devices 106 may be connected to transformers (e.g., distribution transformers that step down medium voltage to low voltage). The synchronizer device 108 is also mechanically, electrically, and/or communicatively connected to aspects of the power distribution network 104, as further described herein. The synchronizer device 108 may be connected to the network 104 by a transformer, as shown in FIG. 1. In one form the synchronizer device 108 is electrically and/or communicatively coupled to the metering devices 106 via the electric distribution network 104. In another form, aspects of system 100 (e.g., network 104, metering devices 106, synchronizer device 108, etc.) comprise a power-line communication (PLC) system. The rate at which the system 100 is capable of measuring phasors depends on the data rate of the PLC system. In an embodiment, the PLC system has a downlink data rate of 10 to 100 bits per second (bps), which results in an interval rate of about 1 to 10 seconds.

In an embodiment, the power distribution network 104 comprises distribution lines each adapted to carry electric power having different wiring phases. For example, a distribution line 104-A may be adapted to carry electric power having Phase A to metering devices 106-A, a distribution line 104-B may be adapted carry electric power having Phase B to metering devices 106-B, and a distribution line 104-C may be adapted carry electric power having Phase C to metering devices 106-C. In an embodiment, distribution lines of the power distribution network 104 may carry electric power having a combination of Phase A, Phase B, and/or Phase C. For example, when the system includes delta-Y and/or Y-delta transformers the phases of the outputs of these transformers will not be pure Phase A, Phase B, or Phase C, but instead may be a combination of Phase A, Phase B, and/or Phase C. In one form, system 100 utilizes PLC to provide synchronized phasor measurements ubiquitously throughout the power distribution network 104.

The metering devices 106 are placed on the power distribution network 104 wherever synchronous phasor measurements are to be made. The metering devices 106 are capable of digitally receiving (e.g., sampling) VLF-band and/or ULF-band PLC signals, storing firmware and measured phasors on a memory device, and executing the firmware in real-time or near real-time with one or more processors to estimate local phasors relative to the substation phasor, as further described herein. VLF-band PLC signals include those in the range of about 3 kHz to about 30 kHz and ULF-band PLC signals include those in the range of about 0.3 kHz to about 3 kHz. In one form, aspects of the synchronized phasor measurement system 100 utilize PLC signals having a frequency of at least about 1 kHz. The metering devices 106 are incorporated into an advanced metering infrastructure (AMI) system. In one form, metering devices 106 retrieve VLF-band and/or ULF-band signals from baseband mains sampled signals. As shown in FIG. 1, the metering devices 106 are capable of determining active power (P) and reactive power (Q).

The synchronizer device 108, which may be placed at every substation 102 on a three-phase point, is capable of transmitting a VLF-band and/or ULF-band PLC signal on each phase of the network 104. In one form, the synchronizer device 108 is adapted to generate a beacon that will penetrate the power distribution network 104 providing time-reference information and substation 102 phasor information, as further described herein.

In one form, the system 100 is utilized for real-time operations applications such as wide-area situational awareness (e.g., power factor monitoring, voltage or current monitoring and trending, etc.), diagnosing system voltage imbalance, event detection and avoidance (e.g., floating neutral detection, fault detection, etc.), alarming and setting system operating limits, outage detection and restoration, real-time operations planning, and the like. By monitoring power factor and voltage distribution across power distribution network 104 via system 100, optimal placement and setting for devices such as capacitor banks and voltage regulators may be determined. Aspects of system 100 may also provide synchrophasor measurements for calculating voltage unbalance factors which can be utilized to analyze imbalance conditions across the power distribution network 104. Exemplary synchrophasors include measurements of values on the power distribution network 104 (e.g., power, voltage, current, etc.) time-stamped according to a common time reference.

Figure 2:
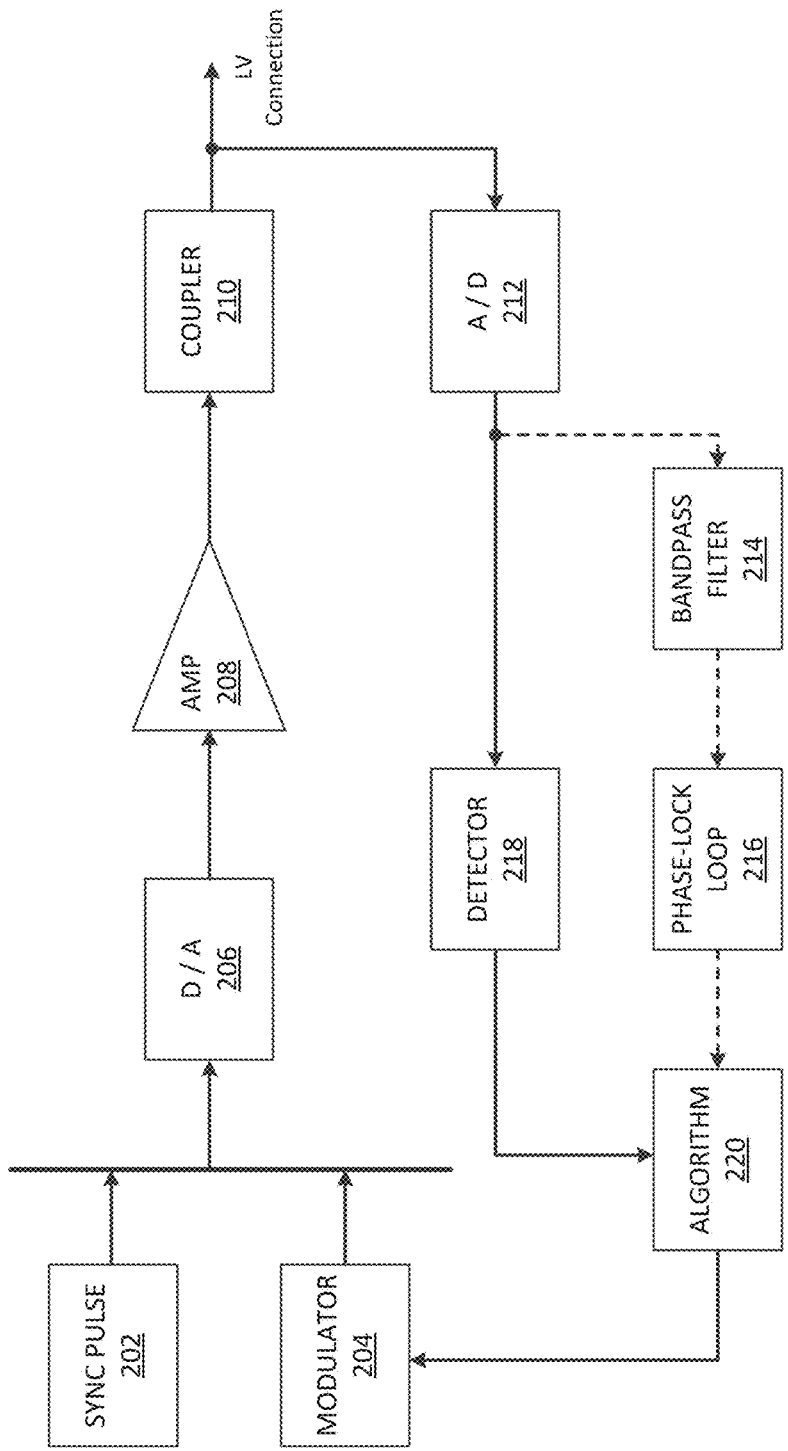
FIG. 2 is a block diagram illustrating one embodiment of an exemplary signal processing chain of the synchronizer of FIG. 1.

FIG. 2 illustrates an exemplary signal processing chain synchronizer device 108 in accordance with an aspect of the invention. In accordance with FIG. 2, synchronizer device 108 generates a beacon that penetrates the network 104 providing time-reference information and substation phasor information. The illustrated signal processing chain includes a synchronization pulse generator 202, a modulator 204, a digital-to-analog (D/A) converter 206, an amplifier 208, a coupler 210, an A/D converter 212, a bandpass filter 214, a phase-locked loop (PLL) 216, a detector 218, and an algorithm 220 stored as processor-readable instructions in a non-transitory, tangible medium such as a memory device and executed by one or more processors.

The synchronization pulse generator 202 is adapted to generate a synchronization pulse for establishing a common time reference between synchronization device 108 and metering devices 106, as further described herein. The modulator 204 is adapted to generate a communications signal encoded with information pertinent for establishing phase references at remote metering devices 106 relative to the synchronization device 108, as further described herein. As an example, co-pending, co-owned U.S. patent application Ser. No. 13/988,461, entitled Mains-Synchronous Power-Line Communications System and Method, filed Jul. 2, 2013, discloses generation and transmission of a signal from a signal modulator via a power distribution system and is incorporated herein by reference in its entirety. In one form, the synchronization pulse (e.g., signal) and the communications signal are combined into a communications package. The D/A converter 206 is adapted to convert the communications package from a digital representation of a quantity (e.g. an amplitude) to a continuous physical quantity (e.g. a voltage). The amplifier 208 is adapted to amplify the analog communications package before transmission across the network 104.

The coupler 210 is adapted to connect the synchronization device 108 to the network 104, block high-voltage mains signals from the rest of the device, and allow the generated analog signals to pass unobstructed onto the power lines of network 104. In one form, the coupler 210 connects the synchronization device 108 to the network 104 by a low voltage (LV) connection. Additionally or alternatively, the coupler 210 comprises a three-phase connection point for the synchronization device 108.

The A/D converter 212 is adapted to sample the mains voltage at the connection point. In an embodiment, the A/D converter 212 is adapted to sample the waveform, from which the voltage magnitude and phase are derived. As shown in FIG. 2, the signal produced by the A/D converter 212 is sent to the detector 218. In an additional or alternative embodiment, the signal produced by the A/D converter 212 is sent to the PLL 216 via a bandpass filter 214, as further described herein. In one form, the need for sending the signal produced by the A/D converter 212 to the PLL 216 via the bandpass filter 214 is governed by the signal-to-noise ratio of the 60 Hz sinewave, as provided in Appendix A. The detector 218 is adapted to analyze the power line waveform to detect a synchronization pulse, if ever one is present. The PLL 216 is adapted to track the phase of the mains voltage. In an additional or alternative embodiment, the PLL 216 is adapted to track the amplitude of the mains voltage. When the algorithm 220 detects a sync signal, the time of detection, phase, and magnitude of the power line voltage and current are stored on a memory device and sent to the modulator 204 for transmission in the next beacon. Additional details regarding algorithm 220 are described herein.

Figure 3:
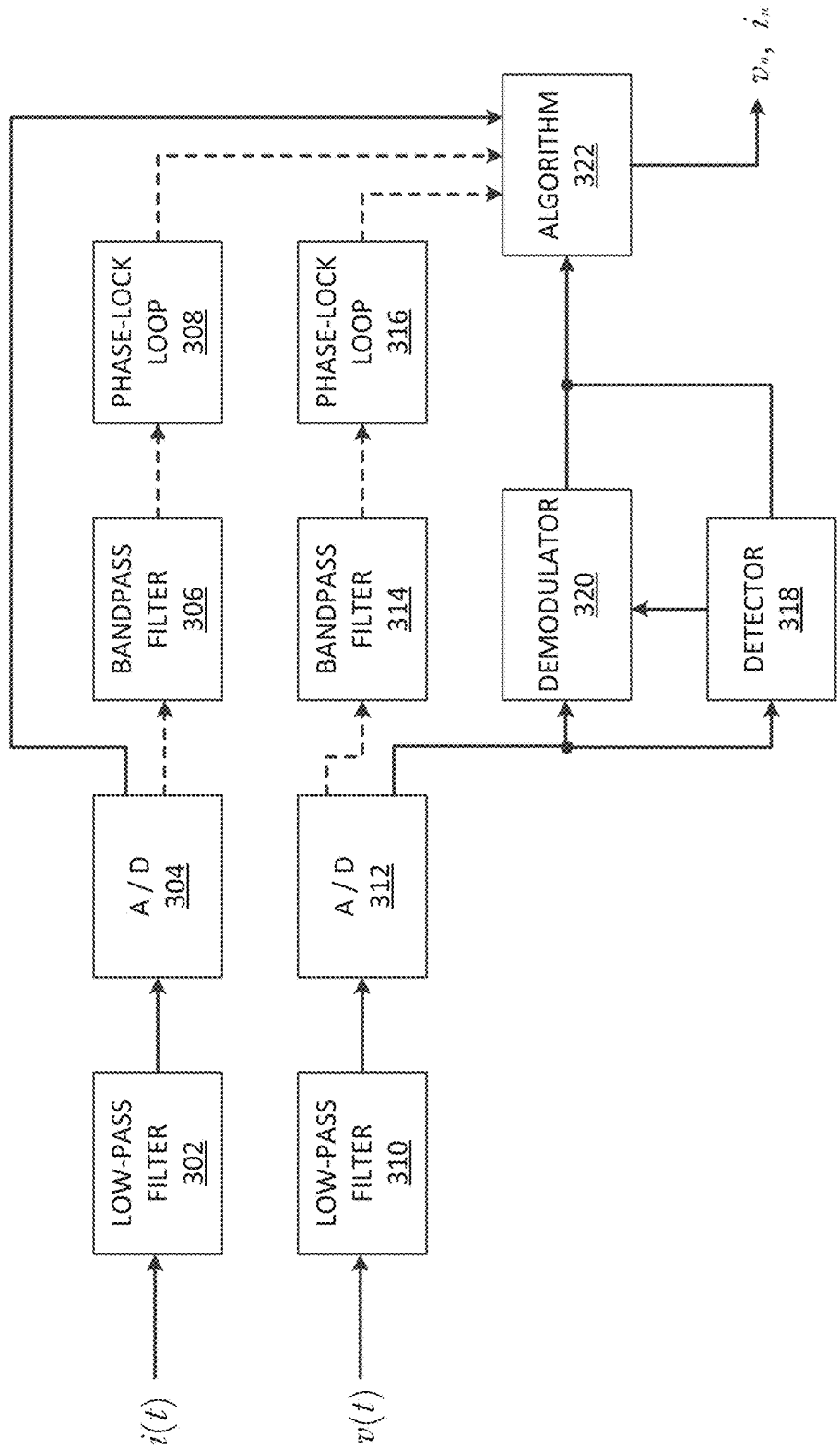
FIG. 3 is a block diagram illustrating one embodiment of an exemplary signal processing chain of the meters of FIG. 1.

FIG. 3 illustrates an exemplary signal processing chain metering device 106 in accordance with an aspect of the invention. In accordance with FIG. 3, metering devices 106 sample the voltage and current observed at the meter point and operate on it with a PLL. The illustrated signal processing chain includes a low-pass filter 302 for the current, an A/D converter 304 for the current, a bandpass filter 306 for the current, a PLL 308 for the current, a low-pass filter 310 for the voltage, an A/D converter 312 for the voltage, a bandpass filter 314 for the voltage, a PLL 316 for the voltage, a detector 318, a demodulator 320, and an algorithm 322 stored as processor-readable instructions in a non-transitory, tangible medium such as a memory device and executed by a processor. In one form, the exemplary signal processing chain illustrated by FIG. 3 is provided by metering devices 106 having filters 302, 310 and A/D converters 304, 312 capable of satisfying the Nyquist criterion for the beacon and an adequate memory device and one or more processors.

The low-pass filters 302 and 310 are antialiasing filters configured as appropriate for the sampling rates of A/D converters 304, 312, respectively. The A/D converter 304 is adapted to convert the filtered current signals passed by low-pass filter 302 from the continuous current quantity to a digital representation of the amplitude of the quantity. Similarly, the A/D converter 312 is adapted to convert the filtered voltage signals passed by low-pass filter 310 from the continuous voltage quantity to a digital representation of the amplitude of the quantity. The sampled current signal produced by A/D converter 304 has the magnitude and phase for the current to be derived therefrom via algorithm 322. The sampled voltage signal produced by A/D converter 312 is sent to the detector 318 which, when it detects a synchronization pulse, causes the magnitude and phase for the voltage to be derived therefrom via algorithm 322. Optionally, the digital signals produced by A/D converters 304 and 312 are sent to PLLs 308 and 316, respectively, via bandpass filters 306 and 314, respectively. The demodulator 320 demodulates the communications package received from the synchronizer device 108, which contains the phase and magnitude of the synchronizer device 108 voltage phasor, the time stamp, and the index, at the time of a previous synchronization pulse as further described herein.

Figure 4:
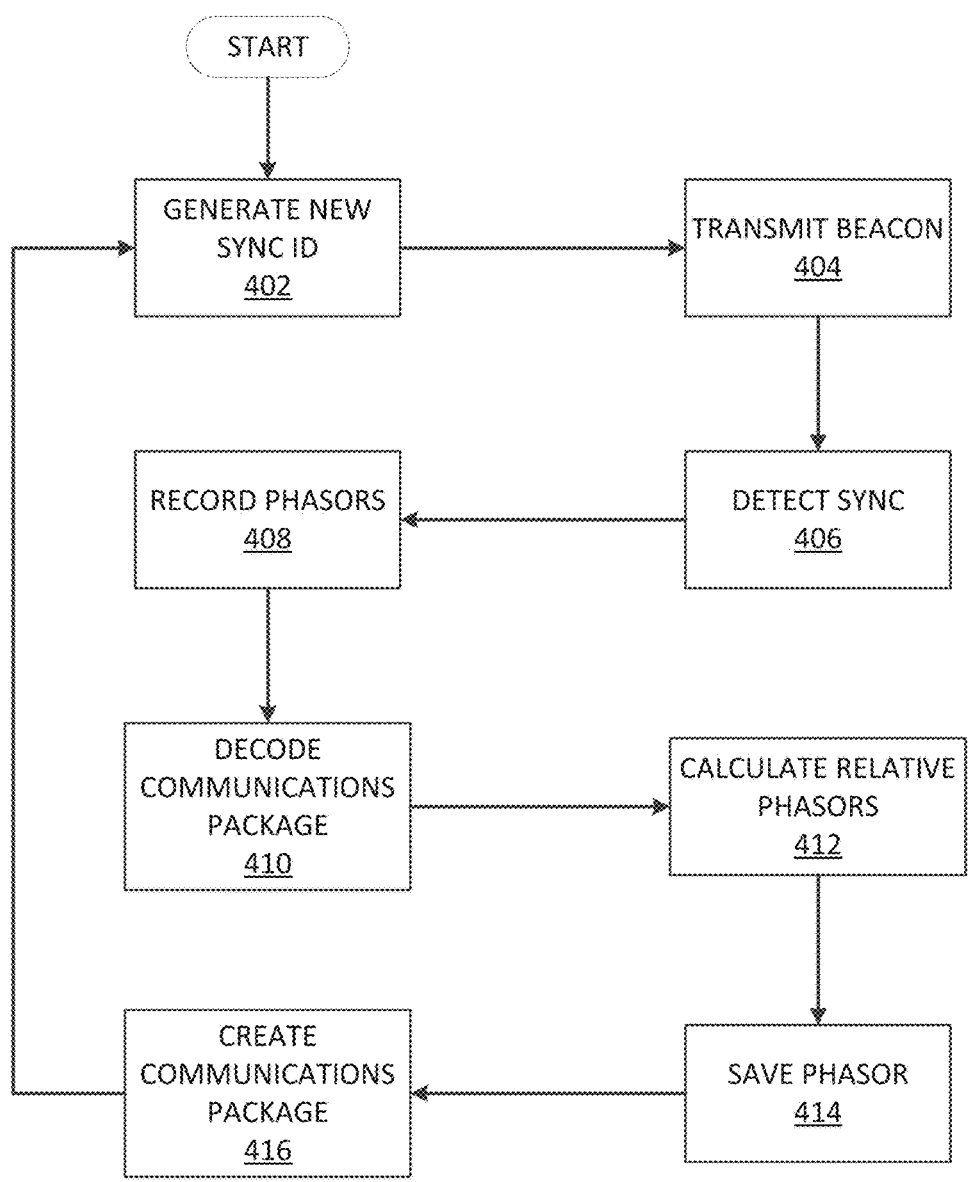
FIG. 4 is a diagram illustrating one embodiment of an exemplary operation of the phasor measurement system of FIG. 1.

FIG. 4 illustrates an exemplary method of operation of the phasor measurement system 100. At step 402, the synchronizer device 108 generates a new synchronization (sync) ID and adds it to the communications package. The purpose of the sync ID is to identify each beacon that the synchronizer device 108 transmits, which allows the metering devices 106 to associate phasor measurements locally with remote phasor measurements. At step 404, the synchronizer device 108 transmits a beacon across the network 104 which consists of a synchronization signal, s(t), generated by the synchronization pulse generator 202 followed by the communications package.

At step 406, matched filters at the synchronizer device 108 (e.g., detector 218) and each of the metering devices 106 (e.g., detector 318) simultaneously, or substantially simultaneously, detect the synchronization signal of the beacon transmitted at step 404. It is contemplated that some devices may not detect the signal. In one form, the devices do not need to detect the signal precisely, as further described herein. The synchronizer device 108 and each of the metering devices 106 marks the voltage and current phasors, during step 408, at the time of the detection at step 406. The recorded voltage and current phasors are provided by the output of the PLLs of each metering device 106.

At step 410, each metering device 106 decodes the communications package. The presence of a communications package is indicated by the detection of the synchronization signal (e.g., step 406). Included in the communications package are phasor measurements at the synchronizer device 108 for the previous beacon. The sync ID of the syncs measured and included in this package is also included so that the correct association can be made. During step 412, each of the metering devices 106 calculates relative phasors by subtracting local phasors from the reference phasor at the synchronizer device 108. In one form, the reference phasors are one iteration old because the communications package includes data from the previous sync and not the current sync. In other forms, the reference phasors may be more than one iteration old or may contain data from the current sync (i.e., the data is zero iterations old). By examining detection times remotely (e.g., at the synchronizer device 108) and locally (e.g., at the metering device 106), differences in the clock rate and clock drift between the meter clock and the synchronizer clock can be inferred. Improved phasor resolution is possible by correcting for the clock drift in accordance with an aspect of the invention, as further described herein.

At step 414, the synchronizer device 108 marks the voltage phasor at its own location at the time of this detection. The synchronizer device 108 also marks the time at which the detection was made. These fields are left blank when the synchronizer device 108 fails detect a sync signal during an iteration. At step 416, the synchronizer device 108 creates a new communications package consisting of the detected sync ID, the recorded voltage phasor, and the timestamp from step 414 before returning to step 402.

In one form, the purpose of the synchronization signal, s(t), is to provide a temporal reference for phasor extraction. Additionally or alternatively, the synchronization signal may also be used by the communications system to signal the beginning of a communications package. The signal received by the metering devices 106 is of the form $$r(t) = h(t) * s(t-\tau) + n_p(t) + n_c(t) \quad (1)$$

where h(t) is the transfer function of the channel between the synchronizer device 108 and the metering device 106. As used herein, a * symbol denotes convolution if used as an operation and complex conjugation if used as a superscript. Additive noise is decomposed into periodic noise, $n_p(t)$, and cyclostationary noise, $n_c(t)$, where $E\ [|n_p(t)|^2] \gg E\ [|n_c(t)|^2]$. The transmitted synchronization signal contains an unknown delay, $\tau$, which synchronization requires to be estimated. If $$s(t) = \Sigma_{n=0}^{N-1} s_n g(t-nT) \quad (2)$$

where T is the mains period and $s_n \in \mathbb{C}$ satisfy $$\Sigma_{n=0}^{N-1} s_n = 0 \quad (3)$$

then the matched detectors 218, 318 are configured to cancel out the periodic noise $n_p(t)$ leaving only the cyclostationary noise $n_c(t)$.

The detection time is given as $$\hat{\tau} = \arg\max r(t) * s^*(-t)$$
$$= \arg\max h(t) * s(t-\tau) * s^*(-t) + n_c(t) * s^*(-t) \quad (4)$$
$$= \arg\max h(t) * R_s(t-\tau) + n_c * s^*(t-\tau)$$

where $$R_s(t) = s(t) * s^*(-t). \quad (5)$$

The Fourier transform of $R_s(t)$ is therefore $F[R_s(t)] = |S(f)|^2$ where $S(f)$ is the Fourier transform of $s(t)$. Since the only source of error in (4) is the second term, the choice of $s(t)$ affects the precision of $\hat{\tau}$. If $s(t)$ lies within the passband of the channel and the gain of that channel is referred to as A, then (7) becomes $$\hat{\tau} = \arg\max AR_s(t-\tau) + n_c(t) * s^*(t-\tau). \quad (6)$$

Thus, the variance of $\hat{\tau}$ decreases with increasing $AR_s(0)$ and with decreasing $E[|n_c(t)|^2]$. Moreover, the width of the mainlobe of the synchronization signal in $R_s(t)$ directly impacts the estimate of the arrival time. Accordingly, a narrower mainlobe results in better precision. For most signals of interest, the mainlobe can only be narrowed by increasing the signal bandwidth. In one form, the variance of $\hat{\tau}$ is improved by increasing its duration and thus its energy. In another form, the variance of $\hat{\tau}$ is improved by increasing its bandwidth.

When the channel transfer function, $h(t)$, is such that $$|s(t) * h(t)|^2 << E[|n_c(t) * s(t)|^2] \quad (7)$$

then the estimate of the arrival time will be very poor. This indicates a channel incapable of propagating the synchronization signal. Signals occupying the spectrum beneath 10 kHz propagate long distances on the power line and thus are well suited for this problem.

The synchronization signal is followed by a communications signal which contains a unique identifier for the beacon to which it is attached. The communications signal also contains information about the phasor extraction at the synchronizer device 108 during a previous beacon. A PLC system in accordance with aspects of the invention is capable of penetrating the electric distribution network 104 and operating in a band (e.g., at least 1 kHz) that is low enough to allow coupling of a digital waveform generator to the LV powerline by means of a linear coupling device (e.g., coupler 210). Exemplary communications systems include the TWACS Gen-V communication system and/or other CDMA-OFDM systems with 4-QAM modulation. In one form the communication system uses a (255,99) BCH code to encode one complete downlink frame over 14 chips with a length 32 spreading code and a downlink data rate of 99/(14×33×1/60)=12.86 bps. Co-pending, co-owned U.S. patent application Ser. No. 13/988,461, entitled Mains-Synchronous Power-Line Communications System and Method, filed Jul. 2, 2013 and incorporated by reference above discloses additional exemplary communication systems.

In another form, aspects of the invention include a communications modulator that does not use a digital waveform generator. For example, a TWACS communications system may accomplish signal generation by a switched-load method. The time-of-arrival problem is restated by modifying (1) as $$r(t) = h(t) * s(t-\tau; \theta) + n_p(t) + n_c(t) \quad (8)$$

where $\theta$ is a nuisance parameter representing the unknown qualities of the TWACS signal for the given transmission. The time-of-arrival estimator estimates these parameters in order to obtain the estimate of $\tau$. Since multiple beacons are transmitted, the receiver tracks these parameters and refines its estimate, and therefore its time estimate, as each beacon arrives. Combining this with the appropriate synchronization algorithm and the time estimate results in phasor measurements. In one form, the communication system includes a digital receiver, has a downlink data rate of about 30 bps, and includes a preamble to serve as the synchronization signal, $s(t)$. In an embodiment in which communications system modems have A/D converters attached to the LV mains, synchrophasor measurement in accordance with aspects of the invention may be implemented as a downloadable firmware update.

Figure 5:
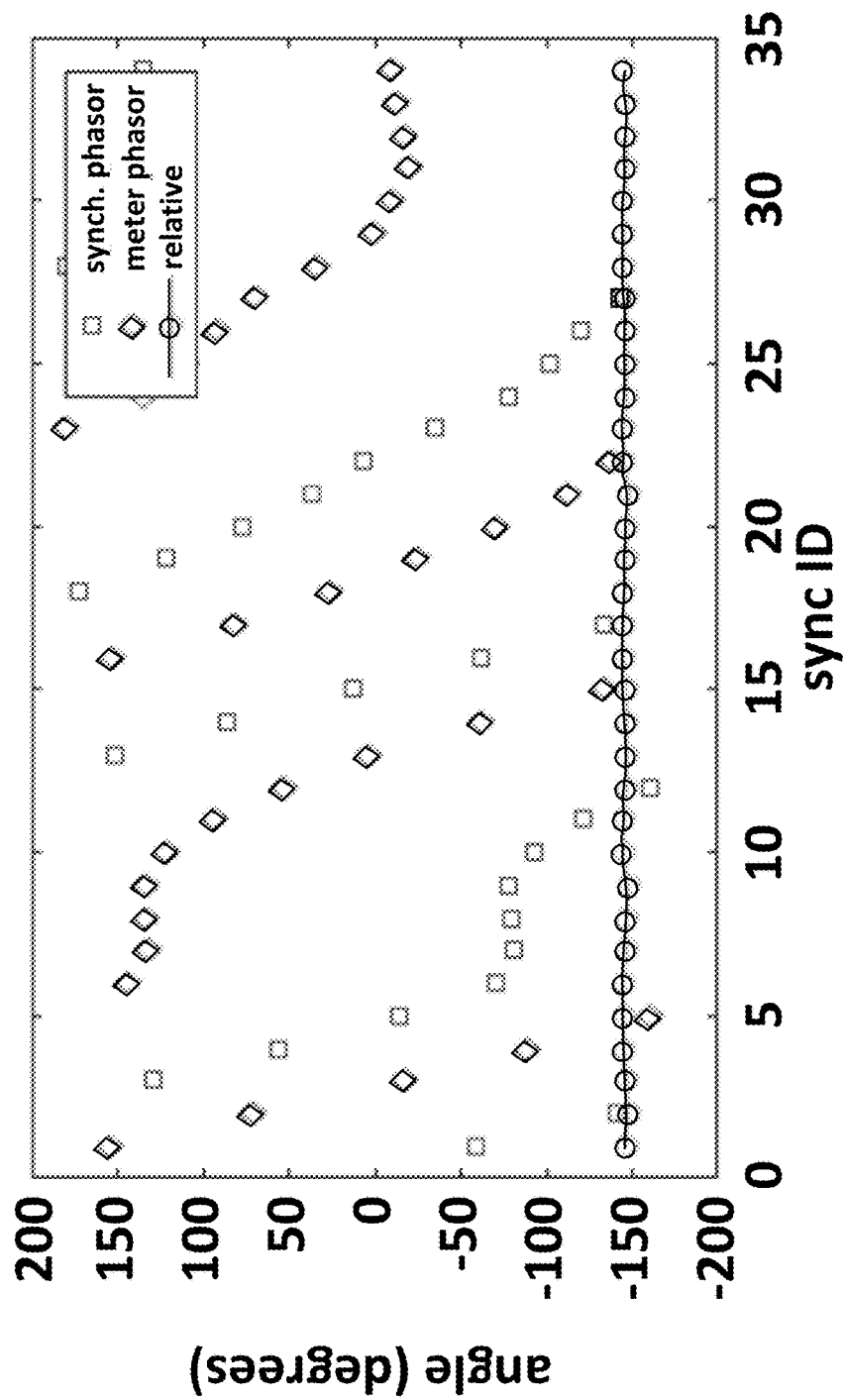
FIG. 5 is a graph illustrating one embodiment of exemplary phasor calculations of the phasor measurement system of FIG. 1.

FIG. 5 illustrates exemplary phasor calculations of the phasor measurement system 100 in which the synchronizer device 108 and the metering device 106 are operating on different wiring phases. With each beacon, the phasors at both the synchronizer device 108 and the metering device 106 are being sampled at irregular intervals, so that the phase angle of each appears random, as illustrated by the squares (phasor for synchronizer device 108) and the diamonds (phasor for metering device 106). As illustrated by the circles and the line, the angle between the phasors, the relative phase angle, is nearly constant. The standard deviation of the phase angle measured in this way is 0.9961°. As described herein, powerline noise introduces error to the time-of-arrival estimate at both the synchronizer device 108 and at the metering device 106. Thus the synchronizer voltage and meter voltage phasors are sampled at slightly different times. These errors are statistically independent. Having the detection time at both locations makes it possible to correct the phasor angle to account for the difference in detection times. For example, this may be accomplished by translating time at the meter to time at the concentrator, such as by synchronizing distant clocks.

Figure 6:
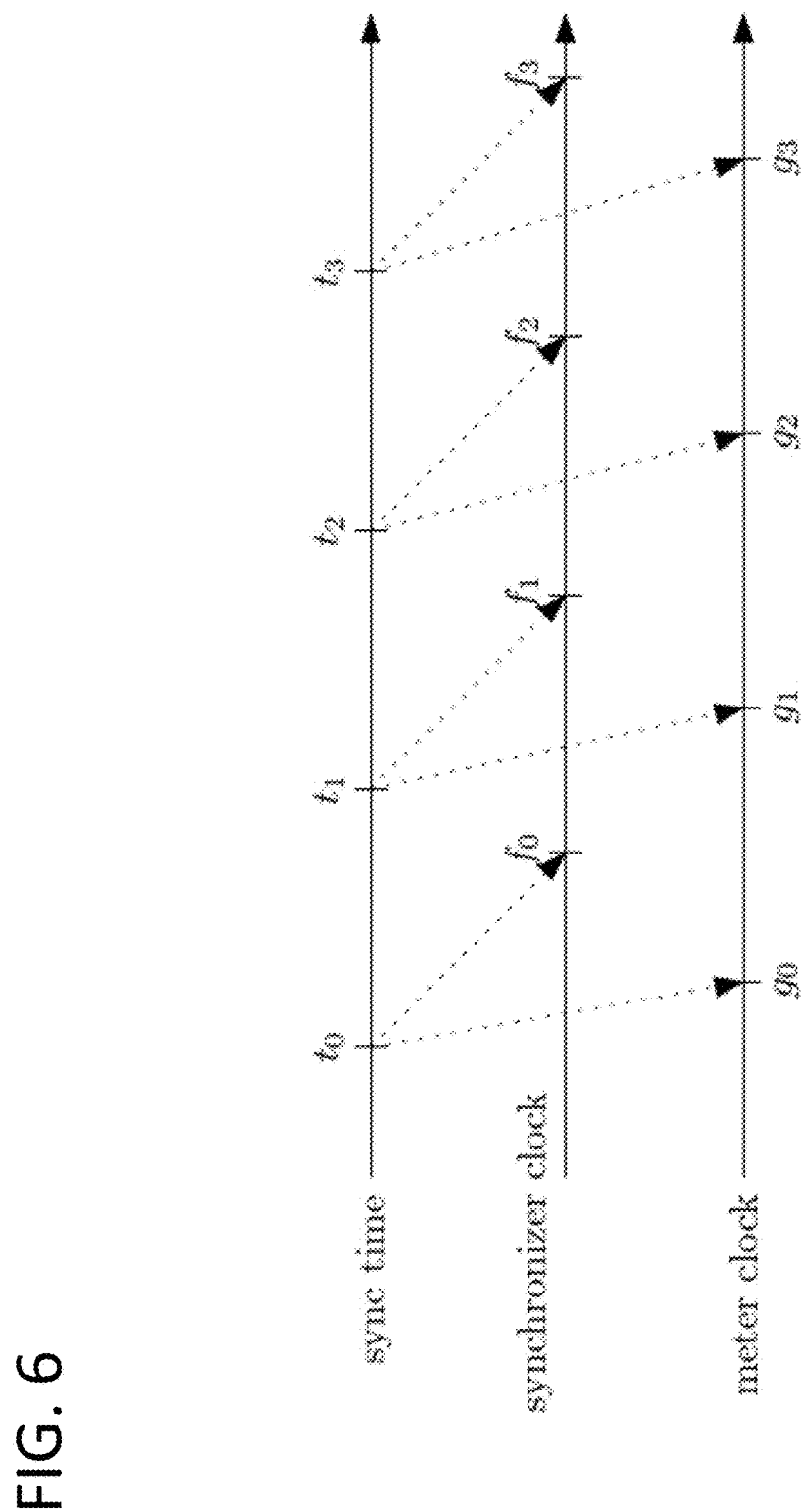
FIG. 6 is a diagram illustrating one embodiment of differences in clock rates between a synchronizer and a meter.

Differences in clock rates on the synchronizer device 108 and on the metering device 106, as well as imperfections in the sync detection time due to signal degradation and noise, create a situation in which simultaneous events are observed at apparently different times. FIG. 6 illustrates an exemplary scenario in which simultaneous events are observed at apparently different times. The detection time error can be particularly troublesome because the phase error is directly proportional to the detection time error at both locations. By observing multiple events with both clocks, the drift of one clock relative to the other may be estimated. Estimating the relative clock drift makes it possible to mitigate the error in the detection time and correct the phase reported at a remote location. For example, the synchronizer device 108 may be considered a remote location relative to the metering device 106 and vice versa.

Consider two unsynchronized clocks that each report the present time as functions $f(t)$ and $g(t)$ of true time $t$. Given that both functions $f$ and $g$ are one-to-one (e.g., will not report the same time at two different times) and continuous, then there exists a function, $h$, that maps the time reported by clock $g$ to the time reported by clock $f$. In other words $h(g(t))=f(t)$. The $h$ function must also be one-to-one and continuous and therefore it can be represented by the expansion $$h(g) = \Sigma_{k=0}^{\infty} h_k (g - g_0)^k \quad (9)$$

Supposing that a sequence of N events are observed on both clocks, if the true times of each event are $t_0, t_1, \ldots, t_{N-1}$, then the times recorded for the nth event on each clock are $$f_n = f(t_n) + e_{f,n} \quad (10)$$

$$g_n = g(t_n) + e_{g,n} \quad (11)$$

where $e_{f,n}$ and $e_{g,n}$ are measurement errors associated with each clock. For example, the errors may be due to the imperfections in estimating the sync time. Given clock f measurements $f_0, f_1, \ldots, f_{N1}$ and clock g measurements $g_0, g_1, \ldots, g_{N-1}$, an estimate of $h_0, h_1, \ldots, h_K$ can be estimated by regression in accordance with an aspect of the invention. This gives a method for converting from one clock to the other. The optimal value of K<N will depend on the clocks.

In one form, the ability to convert from one clock to another can be used to correct errors in the relative phase measurement that are due to differences in the time at which the phases were measured because of the error terms $e_{f,n}$ and $e_{g,n}$. The phasors measured at each clock are derived from complex sinusoids operating at different phase angles:

$$v_{beacon} = \exp(j\omega_c f_n + j\phi_n) \quad (12)$$

$$v_{meter} = \exp(j\omega_c g_n + j\phi_n) \quad (13)$$

The synchronizer phasor, expressed by Equation (12), is observed at a different time than the meter phasor, expressed by Equation (13), because of the error, $e_{f,n}$. The time of observation of the meter phasor in the synchronizer's clock, $h(g_n)$, is estimated However, we can estimate what time the meter phasor was observed in the synchronizer's clock, $h(g_n)$:

$$\begin{aligned} v_{beacon} &= \exp(j\omega_c h(g_n) + j\phi_n) \\ &= \exp(j\omega_c(h(g_n) - f_n) + j\omega_c f_n + j\phi_n) \\ &= \exp(j\omega_c f_n + j\omega_c(h(g_n) - f_n) + j\phi_n) \end{aligned} \quad (14)$$

Equation (14) has the same first term in the kernel as Equation (12), but with a different phase term. This represents a correction in phase due to the difference in sampling times at both locations, given that the sinusoid frequency, $\omega_c$, is known. That phase term is $$\angle(v_{beacon}) = \omega_c(h(g_n) - f_n) + \phi_n \quad (15)$$

In other words, the measured phase at clock r can be corrected by adding $\omega_n(h(g_n) - f_n)$ to it. It is of interest to note that $h(g_n) - f_n$ is the residual from the regressive fit of $g_n$ to $f_n$.

Figure 7:
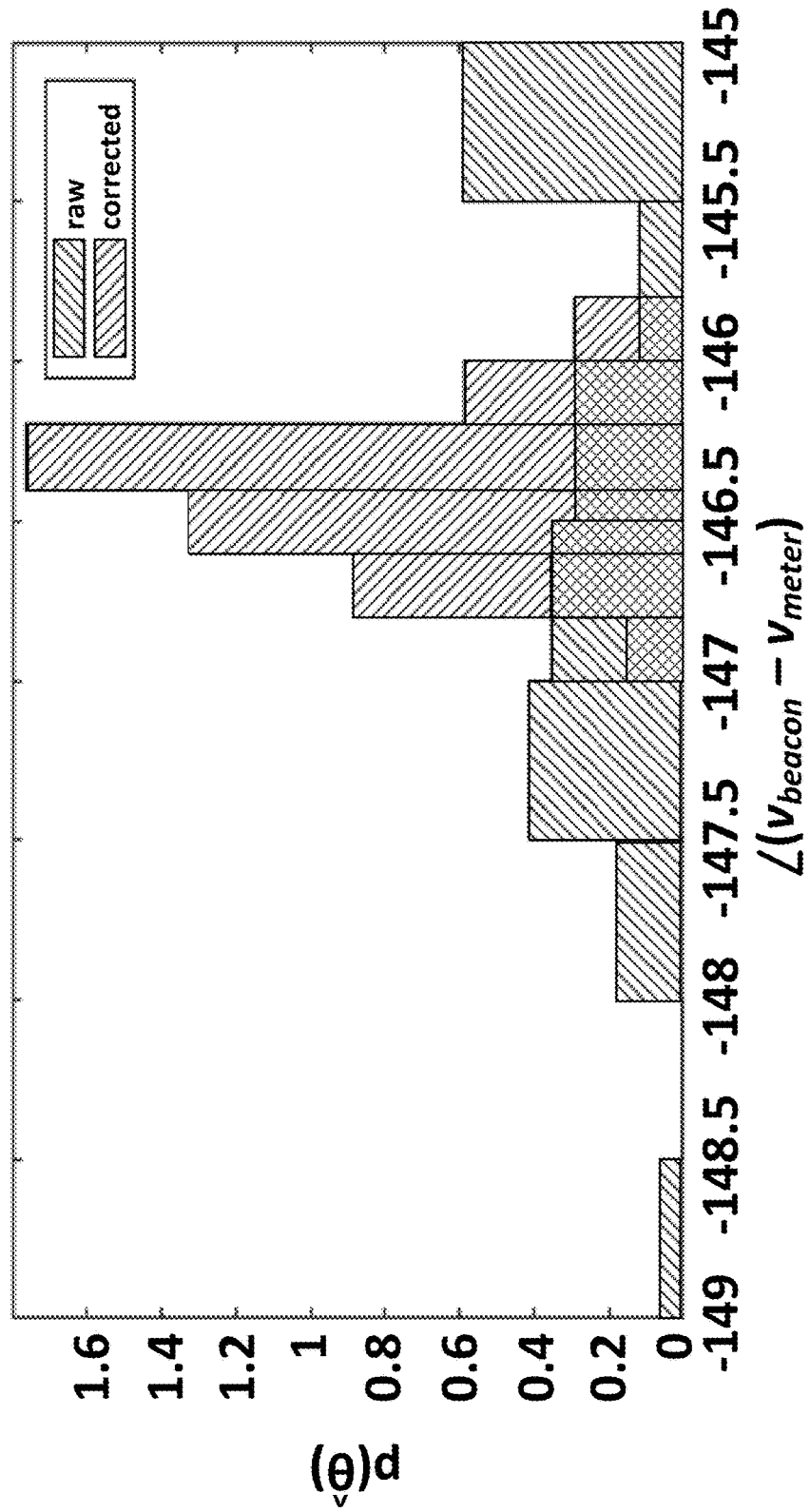
FIG. 7 is a graph illustrating one embodiment of exemplary probability density functions of the phasor measurement system of FIG. 1.

Applying Equation (15) to the data set of FIG. 5 results in the probability density functions illustrated in FIG. 7. The standard deviation of the raw phasors is 0.9961° and the standard deviation of the corrected phasors is 0.2398°. For 60 Hz mains, this corresponds to a time-synchronization standard deviation of 46.1 µs for the raw phasors and 11.1 µs for the corrected phasors. As shown above, the frequency term, $\omega_c$, is the same in both Equations (12) and (13). In one form, this frequency term may be different for both clocks since both clocks progress at a different rate. In another form in which the true sinusoidal frequency is 60 Hz, the clocks f and g do not differ by more than a few parts per million and the difference in frequency is negligible. The synchronization algorithm described herein may also utilize real-time updating of the clock synchronization function, h, such as via a Kalman filter, for example.

In one form, aspects of the invention provide a sine wave phase determination from zero-crossings of its waveform, as further described in Appendix A. The phase of a pure sinusoid at any arbitrary reference time $t_{ref}$ can be determined from the position of its zero-crossings relative to that reference time. This property follows from the fact that the phase angle is a linear function of time when frequency is constant $$\phi(t) = (t_{ref}) + 2\pi[(t - t_{ref})/T], \quad (16)$$

where T, which is the period of the sinusoid, can be determined by measuring the time between any pair of zero-crossings and the number of half-periods that they span.

Once reference time $t_{ref}$ is established, and T is determined, the amount of time between $t_{ref}$ and the next upward (e.g., negative to positive) zero-crossing at $t_{zc+}$ or downward (e.g., positive to negative) zero-crossing at $t_{zc-}$ can be converted into a phase angle. Recognizing that the phase angle of a sine wave is zero, by definition, at an upward zero-crossing $$\phi(t_{zc+}) = 0 = \phi(t_{ref}) + 2\pi[(t_{zc+} - t_{ref})/T] \quad (17)$$

it follows that $$\phi(t_{ref}) = -2\pi[(t_{zc+} - t_{ref})/T] \quad (18)$$

Similarly, the phase of a sinusoid is $\pi$, by definition, at a downward zero-crossing $$\phi(t_{zc-}) = \pi = \phi(t_{ref}) + 2\pi[(t_{zc-} - t_{ref})/T] \quad (19)$$

and it follows that $$\phi(t_{ref}) = \pi - 2\pi[(t_{zc-} - t_{ref})/T] \quad (20)$$

The above technique assumes a pure sinusoid with no DC offset, harmonic content, or noise, which may not hold for powerline waveforms. Powerline waveforms may have significant even-harmonic content that destroys symmetry above and below zero volts or may be corrupted by noise sufficient to create multiple actual zero-crossings in the vicinity of each theoretical zero-crossing. In this case, use of any single measured zero-crossing, upward or downward, as the basis for determination of phase may produce incorrect results because of the noise and distortion in the waveform. The phase expressions in Equations (18) and (20) can be used to exploit multiple measured zero-crossings in a manner that can improve the estimates of both the phase angle at $t_{ref}$ and the sine wave period T, as further described herein.

Figure 8:
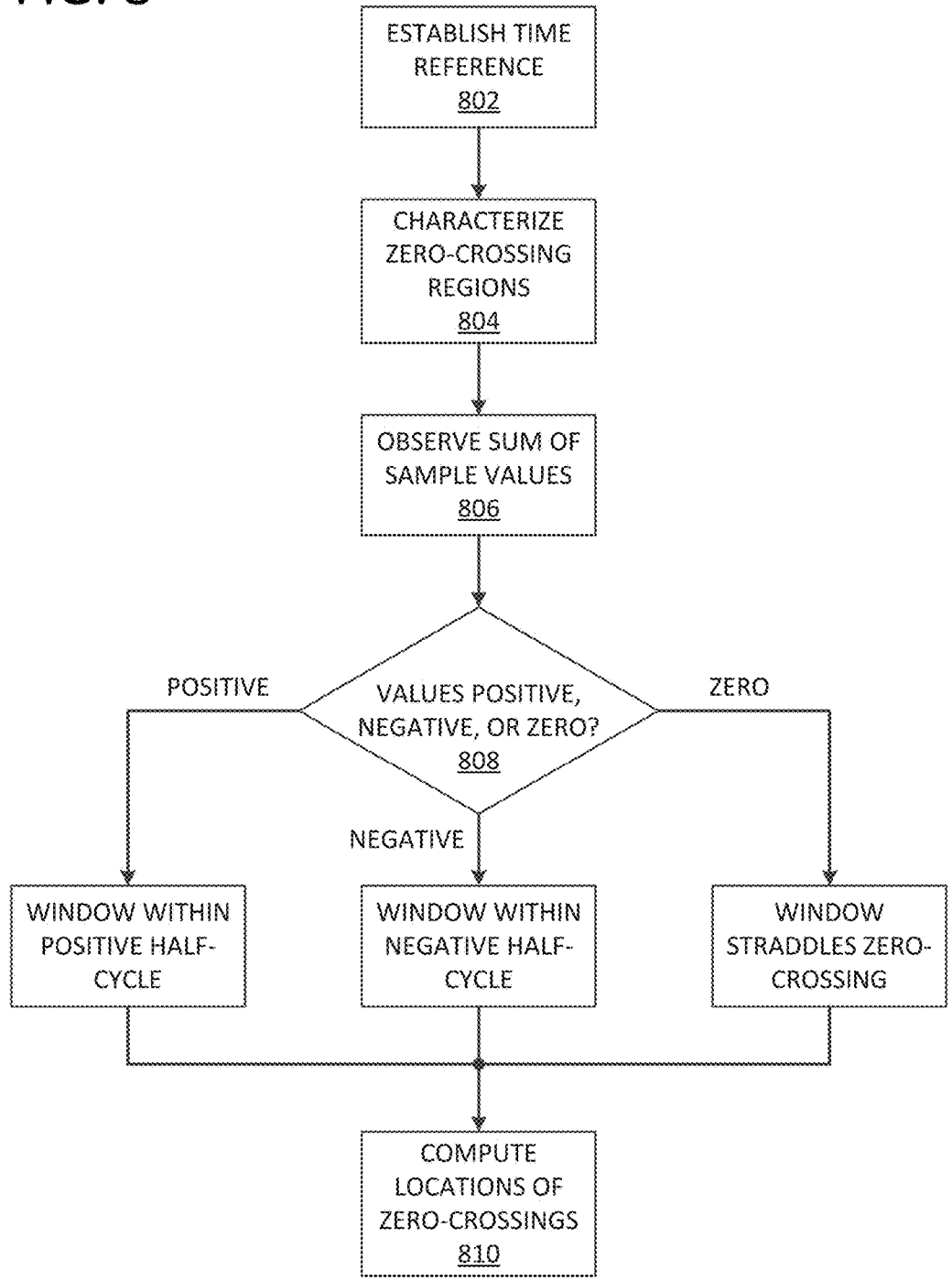
FIG. 8 is a diagram illustrating one embodiment of an exemplary operation of the phasor measurement system of FIG. 1.
Figure 9:
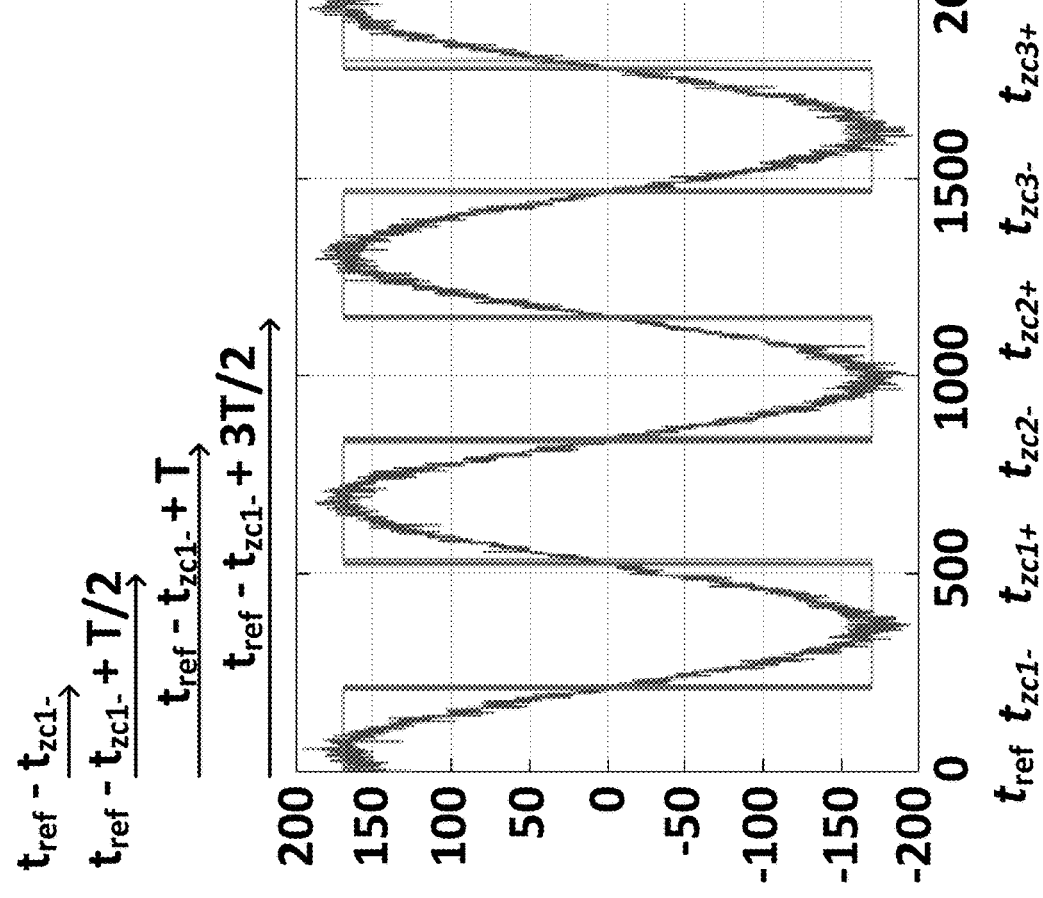
FIG. 9 is a diagram illustrating one embodiment of an exemplary waveform of the phasor measurement system of FIG. 1.

FIG. 8 illustrates an exemplary algorithm stored in a non-transitory, tangible medium such as a memory device and executed by one or more processors for estimating a phase angle at a reference time and a sine wave period. For example the illustrated algorithm may comprise algorithm 220 and/or algorithm 322. FIG. 9 illustrates an exemplary sinusoidal waveform 902 and hard-clipped signal 904 with a reference time and zero-crossing times. PLLs, such as those described herein, are well-suited to extraction of the fundamental component of the power line waveform 902, including tracking the fundamental component through small changes in frequency. The sine wave output of the PLL (e.g., exemplary sinusoidal waveform 902) serves as a representation of the power line fundamental even in low signal-to-noise ratio (SNR) cases. The period and phase of the power line signal sinusoidal waveform 902 can be inferred from measurements of its zero-crossings relative to an arbitrary reference time. Use of multiple zero-crossings improves the estimates of both parameters when the information is utilized in a linear regression. Combination of PLLs with regression of multiple zero-crossings produces certain benefits. For example, the PLL improves the fidelity of the power line waveform and the regression of the zero-crossings of the PLL output waveform improves the fidelity of the estimates of power line period and phase.

With continued reference to FIGS. 8 and 9, the reference time $t_{ref}$ is established at step 802. For phasor measurements, $t_{ref}$ corresponds to the location of the received synchronization pulse, in one form. The actual positions of any zero-crossing regions of the sinusoidal waveform 902 are characterized, at step 804, over a span of one or more half periods. The number of zero-crossing regions to be characterized is arbitrary and need not be consecutive. The algorithm slides a window across the hard-clipped signal 904 and observes the sum of the hard-clipped sample values within that window at step 806. In one form, the hard-clipped signal 904 is a "hard clipped" version of the sinusoidal waveform 902 (e.g., the hard-clipped signal 904 value is +X when the input signal is positive and is −X when the input signal is negative, where X is an arbitrary positive value) that facilitates identification of the zero-crossings. At step 808, it is determined whether the values within the sliding window are positive, negative, or zero. If all or nearly all of the values within the sliding window are positive, then the window is known to be within the positive half-cycle of the sinusoidal waveform 902. If all or nearly all of the values within the sliding window are negative, then the window is known to be within the negative half-cycle of the sinusoidal waveform 902. If the sum or average of the values in the sliding window is approximately zero, then the window straddles a zero-crossing of the sinusoidal waveform 902. The direction of the zero-crossing can be inferred from context. At step 810, the positions of any or all measured zero-crossings within the window are entered into matrix equations and the estimated locations of the actual sinusoidal waveform 902 zero-crossings are computed by linear regression using matrix inversion. For phasor measurements, the algorithm may be applied to the sine wave output of a PLL (e.g., PLLs 216, 308, and/or 316 described herein) where the signal fidelity improvements made by the PLL are augmented by the zero-crossing regression. In another form, such as those situations having a high signal-to-noise ratio, the PLL can be omitted and the zero-crossing regression may be applied directly to the power line waveform.

The matrix equations resulting from the exemplary embodiments illustrated in FIG. 9 are of the form in Equation 21:

$$\begin{bmatrix} t_{zc1-} \\ t_{zc1+} \\ t_{zc2-} \\ t_{zc2+} \\ t_{zc3-} \\ t_{zc3+} \\ \vdots \end{bmatrix} = \begin{bmatrix} 1 & 0 \\ 1 & 1/2 \\ 1 & 1 \\ 1 & 11/2 \\ 1 & 2 \\ 1 & 21/2 \\ \vdots & \vdots \end{bmatrix} \begin{bmatrix} t_{init} \\ T \end{bmatrix} \quad (21)$$

For the exemplary embodiment of FIG. 9, where there are multiple zero-crossings in each zero-crossing region, the matrix equations are of the form in Equation 22:

$$\begin{bmatrix} 270.5 \\ 290.5 \\ 292.5 \\ \vdots \\ 589.5 \\ 599.5 \\ 606.5 \\ 620.5 \\ \vdots \\ 901.5 \\ \vdots \end{bmatrix} = \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix} \begin{bmatrix} t_{init} \\ T \end{bmatrix} \quad (22)$$

Values for $t_{init}$ and T may be estimated from zero-crossings in one or more zero-crossing regions of the input sinusoid by means of a Moore-Penrose pseudoinverse as in Equation 23:

$$\left[ \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix}^T \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix} \right]^{-1} \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix}^T \begin{bmatrix} 270.5 \\ 290.5 \\ 292.5 \\ \vdots \\ 589.5 \\ 599.5 \\ 606.5 \\ 620.5 \\ \vdots \\ 901.5 \\ \vdots \end{bmatrix} \approx \begin{bmatrix} t_{init} \\ T \end{bmatrix} \quad (23)$$

Referring further to FIG. 9, the times $t_{zc1-}$ through $t_{zc3+}$ denote an exemplary span of half-periods over which the zero-crossing regions of the waveform are characterized. The algorithm illustrated in FIG. 8 exploits the fact that the time associated with every zero-crossing that occurs after $t_{ref}$ can be expressed as the sum of the time to the initial zero crossing, $t_{init} = t_{zc+} - t_{ref}$ or $t_{init} = t_{zc-} - t_{ref}$ plus an integer multiple of T/2, as illustrated by FIG. 9.

In one form, aspects of the invention provide feasible, low-cost systems and methods for synchrophasor measurement in distribution networks, such as those that include smart infrastructure products and services. The ability to measure voltage and current phasors relative to the substation will facilitate solutions to outstanding smart grid problems, as described herein. In accordance with an aspect of the invention, outbound TWACS may be used to generate beacons.

In another form, aspects of the invention provide systems and methods capable of wiring phase detection, floating neutral detection, identification of undesirable wiring scenarios, load imbalances, and excessive neutral current. The systems and methods provide real-time monitoring and management of phasor data, retrieve phasors across a network, even if bandwidth-limited, estimate phasors at nodes not containing sensors by combining probabilistic inference with knowledge of the electrical parameters of the network, and identify faulty equipment from phasor data. For example, U.S. patent application Ser. No. 15/088,971, incorporated herein by reference in its entirety, provides additional information regarding combining probabilistic inference with knowledge of electrical parameters of the network.

In yet another form, aspects of the invention provide at least some degree of autonomous control over system 100 by including capacitor banks, voltage regulators, and feeder switching controls in an advanced metering infrastructure (AMI) network. For example, these control devices can be implemented with a positive feedback loop to automatically maintain high power factor and voltage balance by real-time analysis of synchronized phasor data as described herein. The systems and methods described herein are also capable of utilizing more than just sparsely sampled phasors from the network. For example, time-synchronous signal monitoring may be provided by every metering device on a network. In accordance with such systems and methods, full time-domain sampled signals are retrieved from every endpoint (e.g., metering device 106). Such a technique may be utilized to locate faults before and after critical system events, control distributed generation sources, and like system monitoring functions.

As will be understood by one having ordinary skill in the art, aspects of the invention described herein cannot be attained by putting a GPS device on each meter and using the common time base it provides because the reference phase information required for the computation of phasor angles is not available to remote devices. For example, a GPS-based implementation requires the raw, unreferenced phasors to be uploaded to a central processing station, which burdens the AMI system, requires time for communications transmission, and may be limited to transmission networks.

As described herein, some or all of the various device components can be digital components comprising software or firmware stored in a non-transitory, tangle medium such as a memory device and executed by one or more processors.

The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

What is claimed is:

1. A system, comprising:
   an electric distribution network;
   at least one metering device connected to the electric distribution network; and
   a synchronizer device connected to the electric distribution network at a three-phase point thereof and adapted to generate a plurality of beacons each transmitting to the at least one metering device via the electric distribution network, wherein each of the beacons comprises a synchronization pulse adapted to establish a common time reference between the synchronizer device and the at least one metering device, wherein each of the beacons comprises reference phasor data adapted to establish phase references relative to the synchronizer device at the at least one metering device and relative to a time of receiving a previous one of the beacons; and wherein the synchronizer device comprises:
      a synchronization pulse generator adapted to generate the synchronization pulse of the beacon;
      a coupler adapted to couple the synchronizer device to the electric distribution network and adapted to transmit the beacons on the electric distribution network;
      an analog-to-digital converter adapted to sample a voltage on the electric distribution network at the coupler;
      a filter detector adapted to detect the transmitted beacons contained in the sampled voltage;
      a phase-locked loop adapted to track a phase of the sampled voltage; and
      a modulator adapted to modulate a time of detection of the beacons, the phase of the sampled voltage at the time of detection, and an amplitude of the sampled voltage with a second synchronization pulse generated by the synchronization pulse generator to generate a second beacon of the plurality of beacons,
   wherein the second beacon enables a phase A metering device, a phase B metering device, and a phase C metering device to each determine a voltage phasor relative to the phase of the voltage at the synchronizer device, and
   wherein the second beacon enables the phase A metering device, the phase B metering device, and the phase C metering device to each determine a current phasor relative to the phase of the voltage at the synchronizer device.

2. The system of claim 1, wherein the at least one metering device comprises a first metering device adapted to meter a first phase on the electric distribution network, and further comprising a second metering device connected to the electric distribution network and adapted to meter a second phase thereon,
   wherein the synchronizer device is further adapted to generate the beacons transmitting to the second metering device via the electric distribution network,
   wherein the synchronization pulse is further adapted to establish the common time reference between the synchronizer device and the second metering device, and
   wherein the reference phasor data is further adapted to establish phase references relative to the synchronizer device at the second metering device.

3. The system of claim 2, wherein the first metering device comprises the phase A metering device and wherein the second metering device comprises one of the phase B metering device and the phase C metering device.

4. The system of claim 2, wherein the first metering device comprises the phase B metering device and wherein the second metering device comprises one of the phase A metering device and the phase C metering device.

5. The system of claim 2, wherein the first metering device comprises the phase C metering device and wherein the second metering device comprises one of the phase A metering device and the phase B metering device.

6. The system of claim 2, wherein the electric distribution network includes at least a first substation, wherein the first metering device and the second metering device are each connected via the electric distribution network to the first substation, and wherein the synchronizer device comprises the first substation.

7. The system of claim 2, wherein the electric distribution network comprises an alternating-current, three-phase electric distribution network, and wherein the synchronizer device is adapted to transmit the generated beacons on at least one of the three phases.

8. The system of claim 2, further comprising a third metering device connected to the electric distribution network and adapted to meter a third phase thereon,
   wherein the synchronizer device is further adapted to generate the beacons transmitting to the third metering device via the electric distribution network,
   wherein the synchronization pulse is further adapted to establish the common time reference between the synchronizer device and the third metering device, and
   wherein the reference phasor data is further adapted to establish phase references relative to the synchronizer device at the third metering device.

9. The system of claim 1, wherein the synchronizer device is adapted to transmit the beacons via the electric distribution network at a frequency of greater than or equal to approximately 1 kHz.

10. The system of claim 1, wherein each of the beacons further comprises a communications package following the synchronization pulse.

11. The system of claim 1, wherein the synchronizer device and the at least one metering device each comprises at least one of the phase-locked loop and a frequency-selective filter adapted to track a frequency at which alternating current power oscillates on the electric distribution network.

12. The system of claim 11, wherein the synchronization pulse of the beacons provides a temporal reference for determination of a phase angle of an output signal of at least one of the phase-locked loop and the frequency-selective filter of each synchronizer device and indicates the presence of a communications package.

13. The system of claim 11, wherein at least one of the phase-locked loop and the frequency-selective filter of each synchronizer device is adapted such that a voltage waveform and a current waveform can be sampled at arbitrary times.

14. The system of claim 1, wherein the reference phasor data of the beacons provides synchronous phasor measurements indicative of at least one of the voltage and a current on the electric distribution network at a connection point of the synchronizer device.

15. The system of claim 1, wherein the at least one metering device comprises:
an interface adapted to couple the metering device to the electric distribution network;
a processor; and
one or more processor-executable instructions stored on a non-transitory processor-readable storage medium of the metering device, said processor-executable instructions comprising:
instructions for configuring the metering device to receive the beacons from the electric distribution network via the interface;
instructions for configuring the metering device to detect the synchronization pulse of the received beacons;
instructions for configuring the metering device to record on the storage medium a voltage phasor and a current phasor of electric power on the electric distribution network at the metering device at a time of said detecting;
instructions for configuring the metering device to decode the reference phasor data of the received beacons, wherein the reference phasor data comprises a reference voltage phasor at a connection point of the synchronizer device and a reference current phasor at the connection point of the synchronizer device;
instructions for configuring the metering device to determine a phase difference between the recorded voltage phasor at the metering device and the reference voltage phasor at the connection point of the synchronizer device; and
instructions for configuring the metering device to determine a phase difference between the recorded current phasor at the metering device and the reference current phasor at the connection point of the synchronizer device.

16. The system of claim 15, wherein the processor-executable instructions further comprise:
instructions for configuring the metering device to establish a reference time corresponding to a temporal location of the synchronization pulse of the received beacons;
instructions for configuring the metering device to characterize positions of zero-crossing regions of a waveform indicative of electric voltage on the electric distribution network over a span of one or more half-periods of said waveform;
instructions for configuring the metering device to estimate a period and a phase of the voltage waveform by linear regression of the positions of one or more zero-crossings within the zero-crossing regions;
instructions for configuring the metering device to characterize positions of zero-crossing regions of a waveform indicative of electric current on the electric distribution network over a span of one or more half-periods of said waveform; and
instructions for configuring the metering device to estimate a period and a phase of the current waveform by linear regression of the positions of one or more zero-crossings within the zero-crossing regions.

17. A method, comprising:
generating, by a synchronizer device, a first beacon comprising a first synchronization pulse and a first communications package;
transmitting, by the synchronizer device, the first beacon to one or more electric meters connected to the synchronizer device via an electric distribution network, wherein the synchronizer device is coupled to the electric distribution network at a three-phase connection point;
measuring, by the synchronizer device, a phase and an amplitude of a voltage on the electric distribution network at the three-phase connection point during said transmitting of the first beacon, wherein the measured voltage phase and the measured voltage amplitude comprise a reference voltage phasor corresponding to the first synchronization pulse;
generating, by the synchronizer device, a second beacon comprising a second synchronization pulse and a second communications package, wherein the second communications package comprises the reference voltage phasor corresponding to the first synchronization pulse; and
transmitting, by the synchronizer, the second beacon to the electric meters via the electric distribution network, wherein the second beacon enables the electric meters to determine a voltage phasor measured thereat relative to the reference voltage phasor at a time of receiving the first beacon.

18. The method of claim 17, wherein the second communications package further comprises the reference voltage phasor, a time stamp, and an index corresponding to the first synchronization pulse.

19. The method of claim 17, further comprising measuring, by the synchronizer device, a phase and an amplitude of a current on the electric distribution network at the three-phase connection point during said transmitting of the first beacon, wherein the measured current phase and the measured current amplitude comprise a reference current phasor corresponding to the first synchronization pulse.

20. The method of claim 19, wherein the second communications package further comprises the reference current phasor, a time stamp, and an index corresponding to the first synchronization pulse, and wherein the second beacon enables the electric meters to determine a current phasor measured thereat relative to the reference current phasor at the time of receiving the first beacon.

21. The method of claim 17, wherein the electric distribution network comprises an alternating-current, three-phase electric distribution network, wherein said transmitting the first beacon comprises the synchronizer transmitting the first beacon on at least one of the three phases, and wherein said transmitting the second beacon comprises the synchronizer transmitting the second beacon on at least one of the three phases.

22. The method of claim 17, wherein said transmitting the first beacon comprises the synchronizer transmitting the first beacon via the electric distribution network at a frequency of greater than or equal to approximately 1 kHz, and wherein said transmitting the second beacon comprises the synchronizer transmitting the second beacon via the electric distribution network at a frequency of greater than or equal to approximately 1 kHz.

23. The method of claim 17, further comprising:
receiving, by the electric meter, the second beacon;
detecting, by the electric meter, the second synchronization signal comprising the second beacon;

storing, by the electric meter on a storage device thereof, the voltage phasor of electric power on the electric distribution network at a time of said detecting;

storing, by the electric meter on the storage device thereof, a current phasor of electric power on the electric distribution network at the time of said detecting;

decoding, by the electric meter, the second communications package of the second beacon;

determining, by the electric meter, a phase difference between the stored voltage phasor and the reference voltage phasor; and determining, by the electric meter, a phase difference between the stored current phasor and a reference current phasor.

24. The method of claim 23, further comprising:

tracking, by a phase-locked loop comprising the synchronizer, a phase of the alternating-current power on the electric distribution network at the connection point of the synchronizer device; and tracking, by a phase-locked loop comprising the electric meter, a phase of the alternating-current power on the electric distribution network at the electric meter.

25. The method of claim 24, wherein the first synchronization signal of the first beacon provides at least one of a temporal reference for sampling the first beacon the electric meter and a signal for the first communications package, and wherein the second synchronization signal of the second beacon provides at least one of a temporal reference for sampling the second beacon by the electric meter and a signal for the second communications package.

26. The method of claim 24, further comprising extracting, by the electric meter, a magnitude and a phase of the voltage phasor and the current phasor at arbitrary times.

27. The method of claim 17, further comprising:

establishing, by the electric meter, a time reference corresponding to a temporal location of the first synchronization pulse;

characterizing, by the electric meter, positions of zero-crossing regions of a waveform indicative of electric voltage on the electric distribution network over a span of one or more half-periods of said waveform;

estimating, by the electric meter, a period and a phase of the voltage waveform by linear regression of the positions of one or more zero-crossings within the zero-crossing regions;

characterizing, by the electric meter, positions of zero-crossing regions of a waveform indicative of electric current on the electric distribution network over a span of one or more half-periods of said waveform; and estimating, by the electric meter, a period and a phase of the current waveform by linear regression of the positions of one or more zero-crossings in the zero-crossing regions.

28. The method of claim 17, wherein the second communications package comprises synchronous phasor measurements indicative of at least one of a voltage and a current on the electric distribution network at the connection point of the synchronizer device.

* * * * *